United States Patent
Hsu et al.

(10) Patent No.: US 12,132,813 B2
(45) Date of Patent: Oct. 29, 2024

(54) CALIBRATION METHOD, STORAGE MEDIUM AND ELECTRONIC APPARATUS

(71) Applicant: JADARD TECHNOLOGY INC., Shenzhen (CN)

(72) Inventors: Yu-Chieh Hsu, Tainan (TW); Ling-Wei Ke, Tainan (TW); Chun-Yu Chen, Tainan (TW); Hong-Yun Wei, Shenzhen (CN)

(73) Assignee: JADARD TECHNOLOGY INC., Shenzhen (CN)

( * ) Notice: Subject to any disclaimer, the term of this patent is extended or adjusted under 35 U.S.C. 154(b) by 98 days.

(21) Appl. No.: 18/105,162

(22) Filed: Feb. 2, 2023

(65) Prior Publication Data
US 2024/0163072 A1    May 16, 2024

(30) Foreign Application Priority Data
Nov. 11, 2022 (CN) .......................... 202211415722.4

(51) Int. Cl.
*H04L 7/00* (2006.01)
(52) U.S. Cl.
CPC .................. *H04L 7/0033* (2013.01)
(58) Field of Classification Search
CPC .................. H04L 7/0033; H03L 7/00
USPC ....................................................... 375/355
See application file for complete search history.

(56) References Cited

U.S. PATENT DOCUMENTS

| | | | |
|---|---|---|---|
| 9,065,607 B2 * | 6/2015 | Maruko | H04L 7/0337 |
| 2008/0231328 A1 * | 9/2008 | Leydier | H03K 5/133 |
| | | | 235/492 |
| 2016/0020896 A1 | 1/2016 | Povazanec et al. | |
| 2018/0131503 A1 * | 5/2018 | Duan | H04L 7/0004 |

FOREIGN PATENT DOCUMENTS

| | | | |
|---|---|---|---|
| EP | 3 678 323 A1 * | 8/2016 | |
| TW | 201601457 A | 1/2016 | |

* cited by examiner

*Primary Examiner* — Helene E Tayong
(74) *Attorney, Agent, or Firm* — ScienBiziP, P.C.

(57) ABSTRACT

The present disclosure provides a calibration method and readable computer storage medium. The calibration method includes: configuring a reference signal source to output a reference signal; delaying the reference signal through a delay chain to output a delay signal; synchronous sampling the reference signal and the delay signal; adding 1 count and obtaining a final count value when the sampling result is in the preset state; determining whether a ratio between the count value and the first quantity is within a preset range; obtaining the average delay time according to the time width of the reference signal wave and the number of the delay units opened in the delay chain when the ratio is within the preset range; and outputting a control signal to the clock recovery circuit according to the average delay time to calibrate the delay time of the clock recovery circuit.

16 Claims, 6 Drawing Sheets

CALIBRATION METHOD, STORAGE MEDIUM AND ELECTRONIC APPARATUS

FIELD

The present disclosure relates to the field of electronic circuits technology, in particular to calibration method, storage medium and electronic apparatus.

BACKGROUND

In the current high-speed serial bus protocol, the clock signal is usually included in the data, and there is no need for an independent clock signal and data parallel transmission. In order to sample data correctly at the receiving end, it is necessary to extract the clock signal from the data signal at the receiving end, that is, the clock recovery process. Appropriate delay time shall be provided during the operation of clock recovery circuit to avoid data transmission failure caused by jitter and skew generated by the circuit. The delay time of each delay unit in the clock recovery circuit may have a deviation, which may cause a large error in the delay time, thus causing the data to be unable to be transmitted normally. In some cases, the delay time of the clock recovery circuit increases by 1% and the corresponding operating frequency decreases by 1% for every 10 degrees of temperature increase; When the voltage increases by 5%, the delay time decreases by 3%, and the corresponding operating frequency increases by 3%. The delay time in the clock recovery circuit is easily affected by the environment, thus affecting data transmission.

Therefore, improvement is desired.

DETAILED DESCRIPTION

It should be noted that when a component is called "electrically connected" to another component, it can be directly on the other component or there can be a centered component. When one component is considered to be "electrically connected" to another component, it can be a contact connection, for example, a wire connection, or a non-contact connection, for example, a non-contact coupling.

In the high-speed serial bus protocol, the clock signal is usually included in the data, and there is no need for an independent clock signal and data parallel transmission. In order to sample data correctly at the receiver, it is necessary to extract the clock signal from the data signal through the clock recovery circuit at the receiver, that is, the clock recovery process.

A clock recovery circuit includes a delay chain, and the delay chain includes a plurality of delay units. The delay chain is used to provide an appropriate delay time to avoid data transmission failure due to jitter (Jitter), offset (Skew) and/or intersymbol interference generated by the circuit. The delay time of each delay unit in the clock recovery circuit may have a deviation, which may cause a large error in the delay time, thus causing the data to be unable to be transmitted normally. In some cases, the delay time of the clock recovery circuit increases by 1% and the corresponding operating frequency decreases by 1% for every 10 degrees of temperature increase; When the voltage increases by 5%, the delay time decreases by 3%, and the corresponding operating frequency increases by 3%. The delay time in the clock recovery circuit is easily affected by the environment, thus affecting data transmission.

An embodiment of the application provides a calibration method, the calibration method can calibrate the delay time in the clock recovery circuit by calculating and obtaining the average delay time of each delay unit, outputting the average delay time to the clock recovery circuit, and assisting the clock recovery circuit to adjust the number of delay units opened. The calibration method provided in the present disclosure can be realized by other circuits connected to the clock recovery circuit, such as the calibration circuit.

Figure 1:
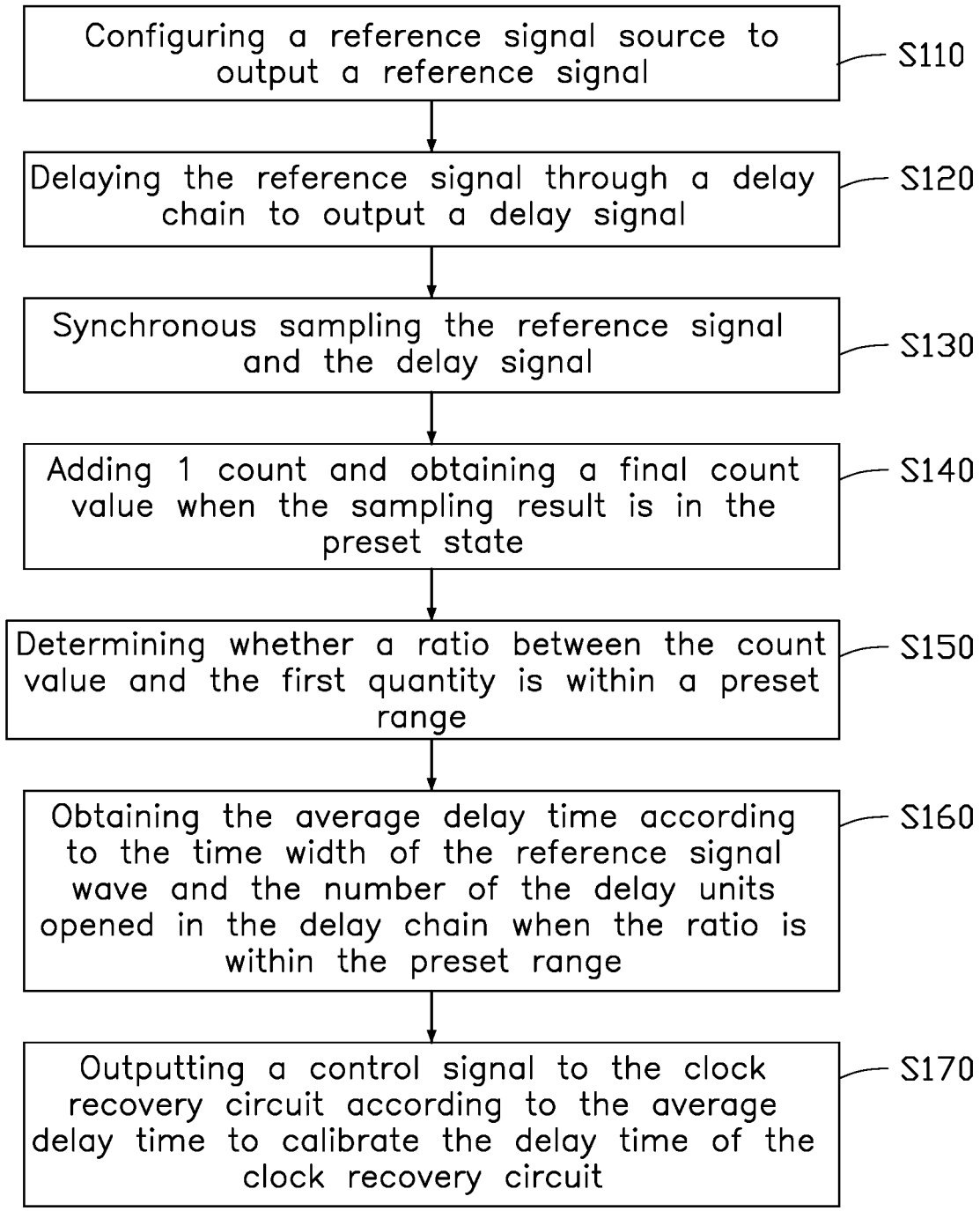
FIG. 1 is a flowchart of a calibration method according to an embodiment of the present disclosure.

A calibration method provided by the embodiment of the disclosure is described in relation to FIG. 1. FIG. 1 is a flowchart of a calibration method according to an embodiment of the present disclosure, the calibration method includes the following steps:

At step S110, configuring a reference signal source to output a reference signal CLOCK. The reference signal CLOCK includes a first number of reference signal waves.

The reference signal source is used to output periodic signals. For example, in some embodiments, the low-speed clock is used as the reference signal source to obtain a more accurate clock signal as the reference signal CLOCK. It can be understood that the present disclosure does not define the type of reference signal source, in other embodiments, other signal sources can be selected as reference signal sources according to the actual situation. For example, in some embodiments, external signal sources, such as external crystal oscillator output reference signal CLOCK, or internal signal sources, such as phase-locked loop output signal, can be used as reference signal CLOCK.

It can be understood that the reference signal wave can be a square wave or a triangle wave, the present disclosure does not limit the waveform and quantity of the reference signal wave. In the embodiment of the present disclosure, the specific working process of the calibration method is illustrated by taking the reference signal wave as the square wave, and the reference signal source outputs 1000 square waves (the first number is 1000) after each startup.

At step S120, delaying the reference signal CLOCK through a delay chain to output a delay signal DLY.

In step S120, the delay chain includes a number of delay units for delaying the reference signal CLOCK. The number of the delay units configured in the delay chain can be adjusted as needed. For example, in the embodiment of the present disclosure, 10 delay units in the delay chain can be configured to delay the reference signal CLOCK and can be adjusted later.

It can be understood that in an ideal state, the number of the delay signal waves of the delay signal DLY is equal to the number of reference signal waves, and the time width of the delayed signal wave is equal to the time width of the reference signal wave. Please further refer to FIG. 2, in an ideal state, the delay signal DLY also has 1000 square waves, and the time width of each square wave is equal to the time width of the square wave in the reference signal CLOCK.

It can be understood that the delay unit can be an inverter, buffer or other component used to delay the phase, or a circuit to realize the delay phase.

At step S130, synchronous sampling the reference signal CLOCK and the delay signal DLY.

At step S140, adding 1 count and obtaining a final count value when the sampling result is in the preset state.

In the present disclosure, the preset state is that the reference signal wave and the delay signal wave overlap at least partially.

For example, in the embodiment of the present disclosure, the reference signal wave is a square wave, and the delay signal wave is also a square wave. In step S140, the preset state can be that the reference signal CLOCK is at the falling edge and the delay signal DLY is at the high level.

Figure 2:
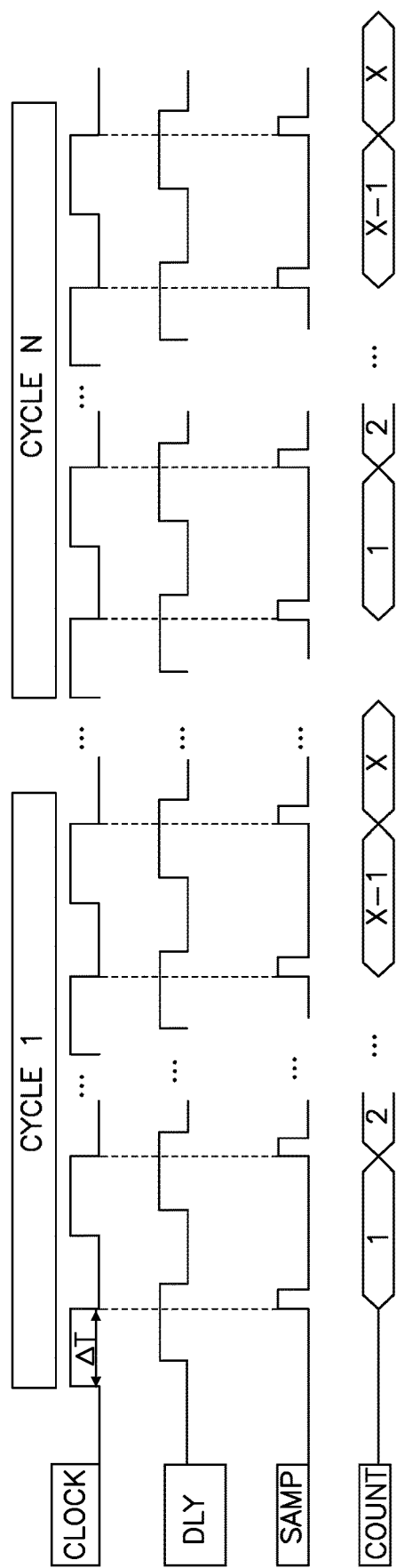
FIG. 2 is a sequence diagram of some signals involved in the flowchart of FIG. 1.

Referring to FIG. 2, when the first reference signal wave of the reference signal and the first delay signal wave of the delay signal meet the preset state, it means that within the time width of the reference signal wave, such as $\Delta T$, the delay chain has delayed the phase of at least one signal in the reference signal CLOCK. Thus, the total delay time of the delay units opened in the current delay chain is less than or equal to $\Delta T$. When the sampling result shows that the reference signal CLOCK is at the falling edge and the delay signal DLY is just at the rising edge, the phase of the delay signal DLY lags behind the phase of the reference signal CLOCK by 180 degrees, it indicates that the total delay time of the delay unit opened in the current delay chain is equal to $\Delta T$.

It can be understood that the time width $\Delta T$ of the reference signal wave is short (for example, it reaches the nanosecond level), when the first reference signal wave of the reference signal and the first delay signal wave of the delay signal meet the preset state, it can be approximately considered that the total delay time of the delay unit opened in the delay chain is $\Delta T$.

When the sampling result is in the preset state, add 1 count. In other words, after the reference signal CLOCK is output, when the sampling result is in the preset state for the first time, it is recorded as 1; when the sampling result is in the preset state again, it is recorded as 2, and so on, until all 1000 reference signals CLOCK and the corresponding 1000 delay signals DLY are synchronously sampled, the final count value is the number of times the sampling result in step S140 is in the preset state.

At step S150, determining whether a ratio between the count value and the first quantity is within a preset range.

It can be understood that in an ideal case, when the phase of the delay signal DLY lags behind the reference signal by less than 180 degrees, the count value obtained in step S140 should be 1000. Due to the possible errors in the operation of the delay chain and/or in the sampling process, the count value obtained in step S140 is slightly less than 1000. When the number of the delay units in the delay chain is too large, the delay signal DLY will lag behind the phase of the reference signal CLOCK by more than 180 degrees, then the count value obtained in step S140 may be far less than 1000. Therefore, a preset range can be set to determine whether the number of delay units set in the current delay chain is appropriate by confirming whether the ratio of the count value to the first quantity is within the preset range. For example, in the embodiment of the present disclosure, the preset range can be [90%, 100%].

For example, in the embodiment of the present disclosure, when the final count value obtained in step S140 is 900, the ratio of the count value to the first quantity is 90%, which falls within the preset range. Therefore, it can be considered that the number of enabled delay units configured in the delay chain in the current step S120 meets the requirements for calculating the average delay time of each delay unit.

It can be understood that the present disclosure does not limit the preset range. In other embodiments, the preset range can be other numerical ranges.

At step S160, obtaining the average delay time according to the time width $\Delta T$ of the reference signal wave and the number of the delay units opened in the delay chain when the ratio is within the preset range.

It can be understood that the number of the delay units configured in step S120 is 10. Take $\Delta T$ as 10 ns (nanosecond) for example, then the average delay time of each delay unit in the delay chain is 1 ns.

When the ratio in step S150 is not within the preset range, the number of the delay units in the delay chain can be reconfigured, and the above steps can be re executed until the ratio is within the preset range, so that the average delay time can be further obtained.

At step S170, outputting a control signal to the clock recovery circuit according to the average delay time to calibrate the delay time of the clock recovery circuit.

It can be understood that the delay unit used to calculate the average delay time in the present disclosure is the same electronic component as the delay unit in the clock recovery circuit. Therefore, the average delay time calculated in step S160 can be converted into a digital signal for output to the clock recovery circuit. The clock recovery circuit adjusts the number of the delay units opened in its own delay chain according to the target delay time and the received average delay time.

It can be understood that the target delay time is the delay time provided by the clock recovery circuit calculated based on multiple groups of experimental data, to reduce the probability of data transmission failure due to jitter, Skew and/or intersymbol interference generated by the circuit.

For example, in some embodiments, the target delay time of the clock recovery circuit is 15 ns, so the average delay time of each delay unit calculated according to step S160 is 1 ns, then the number of the delay units opened by the delay chain of the clock recovery circuit is 15.

It can be understood that in some embodiments, the above calibration method can be run every preset time after the electronic device is powered on to dynamically calculate the average delay time and output it to the clock recovery circuit, so as to dynamically adjust the number of the delay units opened in the clock recovery circuit, and then dynamically calibrate the delay time of the clock recovery circuit.

The calibration method provided in the present disclosure outputs the reference signal CLOCK by configuring the reference signal source, and delays the reference signal CLOCK through the delay chain to obtain the delay signal DLY, it is possible to synchronously sample the reference signal CLOCK and delay signal DLY based on the time width $\Delta T$ of the reference signal wave, estimate the average delay time of each delay unit in the delay chain and output it to the clock recovery circuit to calibrate the delay time of the clock recovery circuit. Compared with the existing method of further adjusting the delay time by decoding the pre sequence of the received packet data, the calibration method provided in the present disclosure does not need to occupy the resources of the data channel, and the adjustment is more convenient and fast, the control logic is simple, and the real-time dynamic calibration for the clock recovery circuit can be realized, thus reducing the interference of temperature, voltage and/or process factors on the delay time of clock recovery circuit.

Figure 3:
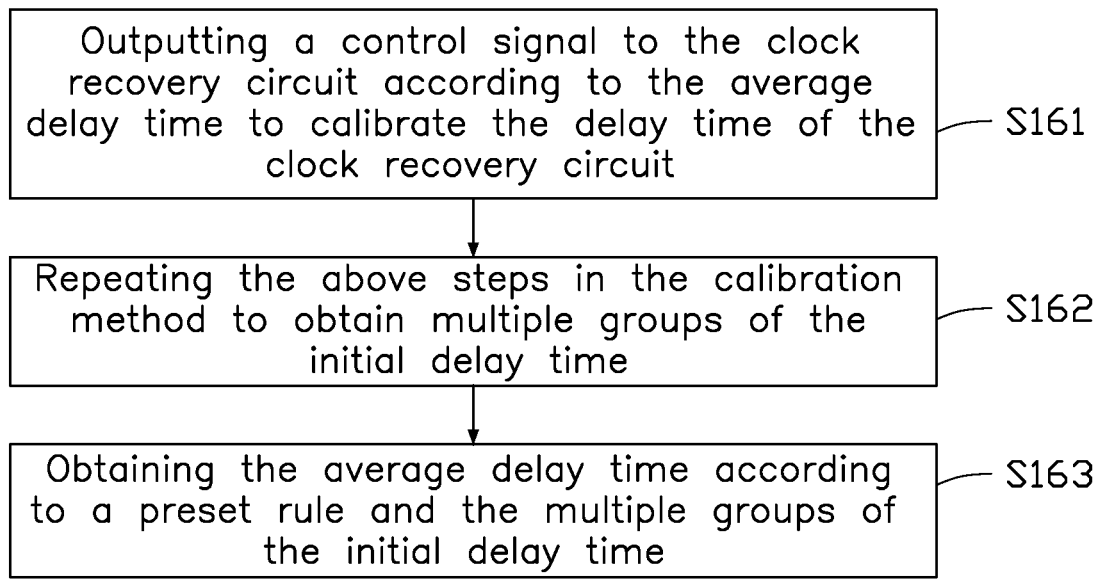
FIG. 3 is a flowchart of sub steps included in step S160 shown in FIG. 1.

Referring to FIG. 3, in some embodiments, step S160 further includes the following steps:

At step S161, obtaining the initial delay time according to the time width of the reference signal wave and the number of the delay units opened in the delay chain.

It can be understood that the method for calculating the initial delay time in step S161 is the same or similar to the method for calculating the average delay time in step S160, which is obtained by dividing the time width ΔT of the reference signal wave by the number of the delay units configured in the delay chain.

At step S162, repeating the above steps in the calibration method to obtain multiple groups of the initial delay time.

It can be understood that after the average delay time is obtained in step S161, steps S110 and S161 are repeated to obtain multiple groups of the initial delay time.

At step S163, obtaining the average delay time according to a preset rule and the multiple groups of the initial delay time.

In some embodiments, the preset rule may be to obtain the average value of the multiple groups of the initial delay time as the average delay time.

In other embodiments, the preset rule may be to obtain the median of the multiple groups of the initial delay time as the average delay time.

It can be understood that in other embodiments, the average delay time may be obtained according to the multiple groups of the initial delay time based on the preset formula. The present disclosure does not specifically limit the preset formula.

In some embodiments, the accuracy of the calculated average delay time can be further improved by obtaining the multiple groups of the initial delay time by executing the above steps S161 to S163.

Figure 4:
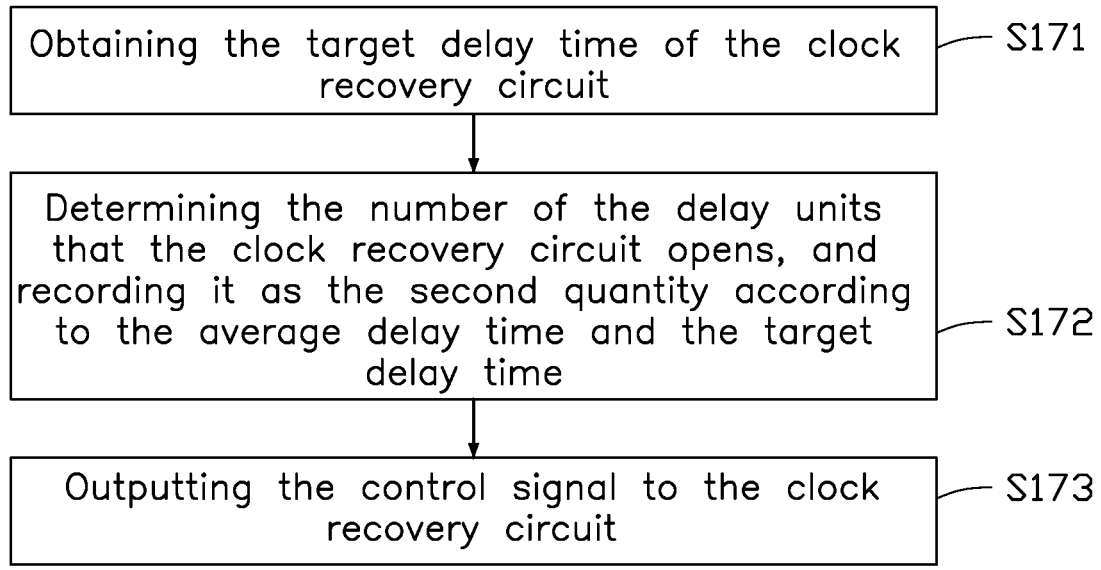
FIG. 4 is a flowchart of sub steps included in step S170 shown in FIG. 1.

Referring to FIG. 4, in some embodiments, step S170 also includes the following steps:

At step S171, obtaining the target delay time of the clock recovery circuit.

At step S172, determining the number of the delay units that the clock recovery circuit opens, and recording it as the second quantity according to the average delay time and the target delay time.

For example, in some embodiments, the number of the delay units enabled by the clock recovery circuit is estimated by dividing the target delay time by the average delay time. It can be understood that when the target delay time divided by the average delay time is not an integer, it can be processed through the rounding function to obtain an integer representing the number of the delay units in the clock recovery circuit.

At step S173, outputting the control signal to the clock recovery circuit. The control signal includes a value of the second quantity.

In step S173, the second quantity is first converted into digital coding, so that the clock recovery circuit can be recovered by outputting a control signal including the coding of the second quantity. After receiving the control signal, the clock recovery circuit adjusts the number of the delay units opened in its delay chain according to the coding information included in the control signal.

It can be understood that in some embodiments, the complexity of the circuit structure of the clock recovery circuit is reduced and the control logic of the clock recovery circuit is simplified by executing the above steps S171 to S173.

In some embodiments, the calibration method further includes receiving a feedback signal, which is used to feedback whether the sampling at the current receiving end is abnormal.

When the feedback signal determines that the sampling at the current receiving end is abnormal, re execute the above steps S110-S170 to recalibrate the delay time of the clock recovery circuit.

It should be noted that the present disclosure does not limit the specific structure of the clock recovery circuit. The calibration method or the calibration circuit provided in the present disclosure is applied to any clock recovery circuit with multiple delay units.

FIG. 3 illustrates a calibration circuit 200 according to an embodiment of the present disclosure. The calibration circuit 200 is used to realize the above calibration method.

The calibration circuit 200 includes a reference signal source 210, a delay chain 220, a sampling circuit 230, a counter 240, a calculation circuit 250, and a control circuit 260.

The reference signal source 210 is used to output a reference signal. The reference signal source 210 is a periodic signal source, and the reference signal includes a first quantity of the reference signal waves.

The delay chain 220 is used to delay the reference signal to output the delay signal. The delay chain 220 includes a plurality of delay units (not shown), and the plurality of the delay units opened in the delay chain 220 can be adjusted.

The sampling circuit 230 is used to synchronously sample the reference signal and the delay signal.

The counter 240 is used to add 1 count when the sampling result of the sampling circuit 230 is in the preset state.

The calculation circuit 250 is used to obtain the final count value of the counter 240 and determine whether the ratio of the count value to the first quantity is within a preset range.

The calculation circuit 250 is also used to calculate the average delay time according to the time width of the reference signal wave and the number of the delay units opened in the delay chain when the ratio is within the preset range.

The control circuit 260 outputs a control signal to the clock recovery circuit according to the average delay time to calibrate the delay time of the clock recovery circuit.

It can be understood that the reference signal source 210, the delay chain 220, the sampling circuit 230, the counter 240, the calculation circuit 250 and the control circuit 260 in the calibration circuit 200 are used to execute the steps in the corresponding embodiments in FIG. 1, FIG. 3 and FIG. 4. For details, please refer to the description of the above related contents and will not repeat them here.

It is understood that the calculation circuit 250 further includes a filter (not shown). The filter is used to realize that the calculation circuit 250 acquires the average delay time from the plurality of groups of the initial delay time when executing steps S161 to S163. It can be understood that in some embodiments, the filter can be an average filter or a median filter, in other embodiments, the filter can also be any one or combination of a Finite Impulse Response (IIR) filter or a Finite Impulse Response (FIR) filter, which is not limited in the disclosure.

Figure 5:
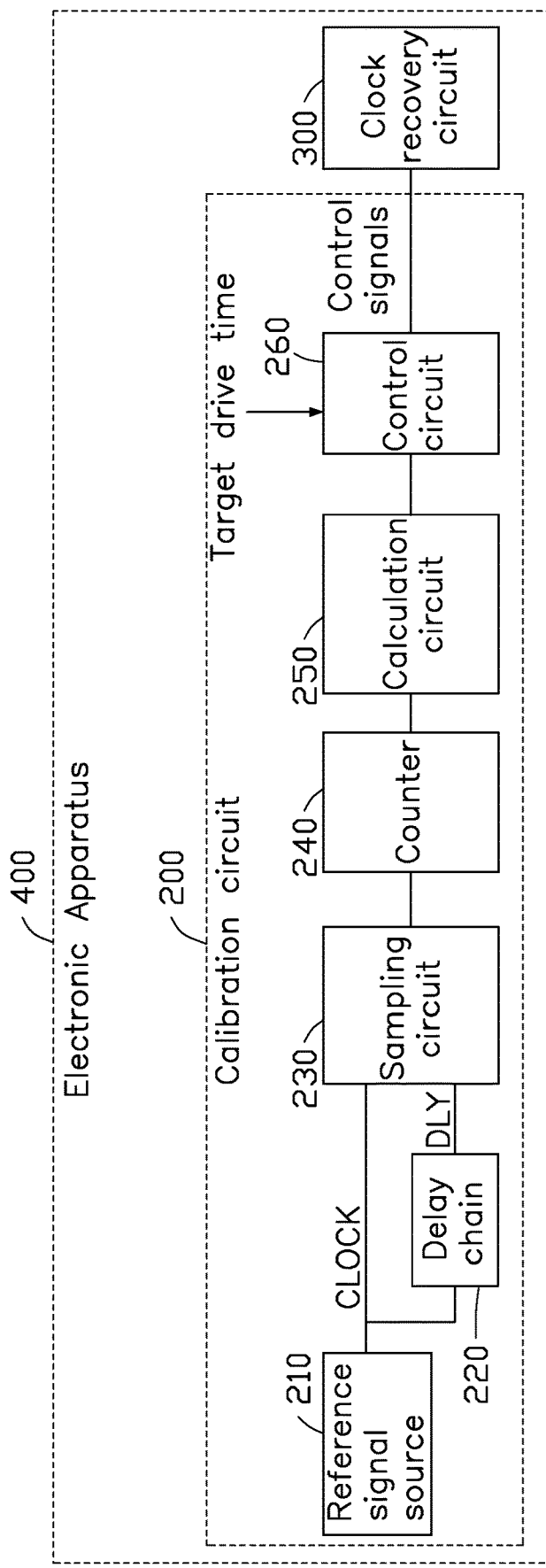
FIG. 5 is a schematic diagram of an electronic apparatus according to an embodiment of the present disclosure.

Referring to FIG. 5, another embodiment of the present disclosure also provides a clock recovery circuit 300. The clock recovery circuit 300 is connected to the calibration circuit 200 as described above. The clock recovery circuit 300 is used to receive the control signal output by the calibration circuit 200, so as to adjust the number of open delay units according to the control signal, and then calibrate the delay time.

It can be understood that the present disclosure does not limit the specific structure of the clock recovery circuit 300. The implementation of the clock recovery circuit 300 should not limit the scope of the present disclosure.

Referring to FIG. 5, another embodiment of the present disclosure also provides an electronic apparatus 400. The electronic apparatus 400 includes a calibration circuit 200 and a clock recovery circuit 300 as described above. It can be understood that in some embodiments, the electronic apparatus 400 can be a slave device with a high-speed transmission interface, such as an interface conforming to the Mobile Industry Processor Interface (MIPI) C-PHY specification, for receiving information from the master device (not shown). In some embodiments, the electronic apparatus 400 may include, but is not limited to, a display, a laptop, a smart speaker and other devices that can receive information.

Figure 6:
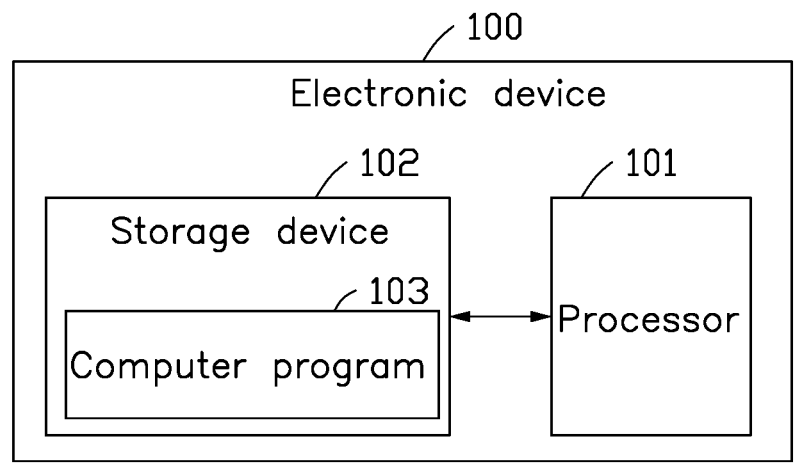
FIG. 6 is a schematic diagram of an electronic device according to an embodiment of the present disclosure.

Referring to FIG. 6, an embodiment of the present disclosure also provides an electronic device 100. The electronic device 100 includes a storage device 102 and a processor 101. The storage device 102 stores a computer program 103 including at least one instruction, and at least one instruction is executed by the processor 101 to implement the above calibration method.

For example, the computer program can be divided into one or more modules/units, and one or more modules/units are stored in the storage device 102 and executed by the processor 101 to complete the calibration method provided by the present disclosure. One or more modules/units may be a series of computer program instruction segments capable of performing specific functions, which are used to describe the execution process of the computer program 103 in the electronic device.

The present disclosure realizes all or part of the flow in the above embodiment method and can be completed by instructing the relevant hardware through the computer program 103. The computer program can be stored in a computer-readable storage medium. When the computer program is executed by the processor, the steps of each method embodiment can be realized. The computer program includes computer program code, which can be in the form of source code, executable file or some intermediate forms. The computer readable medium can include any entity or device capable of carrying computer program code, recording media, USB flash disk, mobile hard disk, magnetic disk, optical disk, computer memory, read only memory (ROM), random access memory (RAM), electrical signal, software distribution media, etc. It should be noted that the contents contained in computer-readable media can be appropriately increased or decreased according to the requirements of legislation and patent practice in jurisdictions. For example, in some jurisdictions, computer-readable medium does not include electric carrier signals and electric signal signals according to legislation and patent practice.

The embodiment of the present disclosure further provides a storage medium. The storage medium is stored with a computer instruction, which enables the computing device to execute the calibration method provided by the above embodiment when the instruction is run on the computing device.

Those of ordinary skill in the art should realize that the above embodiments are only used to illustrate the present disclosure, but not to limit the present disclosure. As long as they are within the essential spirit of the present disclosure, the above embodiments are appropriately made and changes will fall within the scope of protection of the present disclosure.

What is claimed is:

1. A calibration method configured for calibrating a delay time of a clock recovery circuit and comprising:
    configuring a reference signal source to output a reference signal; wherein the reference signal comprises a first quantity of reference signal waves;
    delaying the reference signal through a delay chain to output a delay signal; wherein the delay chain comprises a plurality of delay units;
    synchronous sampling the reference signal and the delay signal;
    adding 1 count and obtaining a count value when a sampling result is in a preset state;
    determining whether a ratio between the count value and the first quantity is within a preset range;
    obtaining an average delay time according to a time width of the reference signal wave and a number of the delay units opened in the delay chain when the ratio is within the preset range; and
    outputting a control signal to the clock recovery circuit according to the average delay time to calibrate the delay time of the clock recovery circuit.

2. The calibration method of claim 1, wherein the delay signal comprises a plurality of delay signal waves, and the preset state is the reference signal wave and the delay signal wave overlap at least partially.

3. The calibration method of claim 1, wherein obtaining an average delay time according to a time width of the reference signal wave and a number of the delay units opened in the delay chain when the ratio is within the preset range comprises:
    obtaining an initial delay time according to the time width of the reference signal wave and the number of the delay units opened in the delay chain;
    repeating the calibration method to obtain multiple groups of the initial delay time; and
    obtaining the average delay time according to a preset rule and the multiple groups of the initial delay time.

4. The calibration method of claim 3, wherein the preset rule comprises:
    obtaining an average value of the multiple groups of the initial delay time as the average delay time. obtaining a median of the multiple groups of the initial delay time as the average delay time.

5. The calibration method of claim 3, wherein the preset rule comprises:
    obtaining a median of the multiple groups of the initial delay time as the average delay time.

6. The calibration method of claim 1, wherein outputting a control signal to the clock recovery circuit according to the average delay time to calibrate the delay time of the clock recovery circuit comprises:
    obtaining a target delay time of the clock recovery circuit;
    determining the number of delay units opened by the clock recovery circuit and recording the number of delay units opened by the clock recovery circuit as a second quantity according to the average delay time and the target delay time; and
    outputting the control signal to the clock recovery circuit; wherein the control signal comprises a value of the second quantity.

7. The calibration method of claim 1, further comprising:
reconfiguring the number of the delay units in the delay chain and re executing the calibration method until the ratio is within the preset range when the ratio is not within the preset range.

8. A non-transitory storage medium having stored thereon instructions that, when executed by a processor, causes the processor to perform a calibration method, wherein the method comprises:
configuring a reference signal source to output a reference signal; wherein the reference signal comprises a first quantity of reference signal waves;
delaying the reference signal through a delay chain to output a delay signal; wherein the delay chain comprises a plurality of delay units;
synchronous sampling the reference signal and the delay signal;
adding 1 count and obtaining a count value when a sampling result is in a preset state;
determining whether a ratio between the count value and the first quantity is within a preset range;
obtaining an average delay time according to a time width of the reference signal wave and a number of the delay units opened in the delay chain when the ratio is within the preset range; and
outputting a control signal to the clock recovery circuit according to the average delay time to calibrate the delay time of the clock recovery circuit.

9. The non-transitory storage medium of claim 8, wherein the delay signal comprises a plurality of delay signal waves, and the preset state is the reference signal wave and the delay signal wave overlap at least partially.

10. The non-transitory storage medium of claim 8, wherein obtaining an average delay time according to a time width of the reference signal wave and a number of the delay units opened in the delay chain when the ratio is within the preset range comprises:
obtaining an initial delay time according to the time width of the reference signal wave and the number of the delay units opened in the delay chain;
repeating the calibration method to obtain multiple groups of the initial delay time; and
obtaining the average delay time according to a preset rule and the multiple groups of the initial delay time.

11. The non-transitory storage medium of claim 10, wherein the preset rule comprises:
obtaining an average value of the multiple groups of the initial delay time as the average delay time. obtaining a median of the multiple groups of the initial delay time as the average delay time.

12. The non-transitory storage medium of claim 10, wherein the preset rule comprises:
obtaining a median of the multiple groups of the initial delay time as the average delay time.

13. The non-transitory storage medium of claim 8, wherein outputting a control signal to the clock recovery circuit according to the average delay time to calibrate the delay time of the clock recovery circuit comprises:
obtaining a target delay time of the clock recovery circuit;
determining the number of delay units opened by the clock recovery circuit and recording the number of delay units opened by the clock recovery circuit as a second quantity according to the average delay time and the target delay time; and
outputting the control signal to the clock recovery circuit; wherein the control signal comprises a value of the second quantity.

14. The non-transitory storage medium of claim 8, further comprising:
reconfiguring the number of the delay units in the delay chain and re executing the calibration method until the ratio is within the preset range when the ratio is not within the preset range.

15. An electronic apparatus comprising:
a calibration circuit configured to output a control signal; and
a clock recovery circuit configured to receive the control signal and adjust a delay time according to the control signal;
wherein the calibration circuit comprises a reference signal source, the reference signal source is configured for outputting a reference signal, and the reference signal comprises a first quantity of reference signal waves;
wherein the calibration circuit further comprises a delay chain, the delay chain is configured to delay the reference signal to output a delay signal, and the delay chain comprises a plurality of delay units;
wherein the calibration circuit further comprises a sampling circuit, the sampling circuit is configured to synchronous sample the reference signal and the delay signal; and
wherein the calibration circuit further comprises a counter, the counter is configured to add 1 count and obtain a count value when a sampling result is in a preset state.

16. The electronic apparatus of claim 15, wherein the calibration circuit further comprises a calculation circuit and a control circuit, the calculation circuit is configured to determine whether a ratio between the count value and the first quantity is within a preset range, obtain an average delay time according to a time width of the reference signal wave and a number of the delay units opened in the delay chain when the ratio is within the preset range; wherein the control circuit is configured to output a control signal to the clock recovery circuit according to the average delay time to calibrate the delay time of the clock recovery circuit.

* * * * *